US011437603B2

(12) United States Patent
Maeda et al.

(10) Patent No.: US 11,437,603 B2
(45) Date of Patent: Sep. 6, 2022

(54) LIGHT-EMITTING MODULE, DISPLAY DEVICE, AND METHODS FOR MANUFACTURING WITH COLOR CHANGING MEMBERS DISPOSED AT NON-WHITE PIXELS

(71) Applicant: Sony Semiconductor Solutions Corporation, Kanagawa (JP)

(72) Inventors: Kensaku Maeda, Kanagawa (JP); Kimihiro Shinya, Kanagawa (JP); Atsushi Yamamoto, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 185 days.

(21) Appl. No.: 16/956,907

(22) PCT Filed: Nov. 28, 2018

(86) PCT No.: PCT/JP2018/043681
§ 371 (c)(1),
(2) Date: Jun. 22, 2020

(87) PCT Pub. No.: WO2019/130956
PCT Pub. Date: Jul. 4, 2019

(65) Prior Publication Data
US 2020/0395575 A1 Dec. 17, 2020

(30) Foreign Application Priority Data
Dec. 29, 2017 (JP) .............................. JP2017-255091

(51) Int. Cl.
*H01L 29/205* (2006.01)
*H01L 51/52* (2006.01)
(Continued)

(52) U.S. Cl.
CPC ...... *H01L 51/5253* (2013.01); *H01L 51/5275* (2013.01); *H01L 51/56* (2013.01); *H01L 27/322* (2013.01)

(58) Field of Classification Search
CPC ........................ H01L 51/5253; H01L 51/5275
See application file for complete search history.

(56) References Cited

U.S. PATENT DOCUMENTS 8,976,436 B2 * 3/2015 Dean .................... G02B 26/005
359/290
2003/0071935 A1 * 4/2003 Maeda .............. G02F 1/133603
349/69
(Continued)

FOREIGN PATENT DOCUMENTS

CN 101075663 A 11/2007
CN 103828486 A 5/2014
(Continued)

*Primary Examiner* — Caleb E Henry
(74) *Attorney, Agent, or Firm* — Michael Best & Friedrich LLP

(57) ABSTRACT

To simplify a process of manufacturing a light-emitting module for displaying an image.
The light-emitting module includes light-emitting elements, a protective layer, color changing members, and an optical layer. The light-emitting elements are arranged on a substrate. The protective layer is formed in such a way as to cover the light-emitting elements. The color changing members are disposed in such a way as to correspond to at least some of the light-emitting elements with the protective layer interposed between the color changing members and the some of the light-emitting elements. The optical layer is formed in such a way as to cover the color changing members and the protective layer. This optical layer condenses or scatters light with its curved shape.

12 Claims, 19 Drawing Sheets

(51) Int. Cl.
*H01L 51/56* (2006.01)
*H01L 27/32* (2006.01)

(56) References Cited

U.S. PATENT DOCUMENTS

| | | | | |
|---|---|---|---|---|
| 2003/0223121 A1* | 12/2003 | Otake | ..................... | G03F 1/50 |
| | | | | 359/619 |
| 2006/0186802 A1* | 8/2006 | Cok | ................... | H01L 51/5268 |
| | | | | 313/506 |
| 2008/0164551 A1 | 7/2008 | Yun | | |
| 2009/0051283 A1 | 2/2009 | Cok et al. | | |
| 2011/0076469 A1* | 3/2011 | Yoneyama | .............. | B32B 23/04 |
| | | | | 427/163.1 |
| 2015/0077966 A1* | 3/2015 | Bessho | .................. | F21V 13/02 |
| | | | | 362/19 |

FOREIGN PATENT DOCUMENTS

| | | |
|---|---|---|
| CN | 104051475 A | 9/2014 |
| JP | 2007-311046 A | 11/2007 |
| JP | 2013-058447 A | 3/2013 |
| JP | 2013/051428 A1 | 4/2013 |
| JP | 2013-149536 A | 8/2013 |
| JP | 2013-251173 A | 12/2013 |
| JP | 2013-254610 A | 12/2013 |
| JP | 2014-179577 A | 9/2014 |
| JP | 2015-187635 A | 10/2015 |
| JP | 2016-118710 A | 6/2016 |
| WO | WO-2017082429 A1 | 5/2017 |

* cited by examiner a b c d e a b c d e a b c d e f a b c d e a b c d e

LIGHT-EMITTING MODULE, DISPLAY DEVICE, AND METHODS FOR MANUFACTURING WITH COLOR CHANGING MEMBERS DISPOSED AT NON-WHITE PIXELS

TECHNICAL FIELD

The present technology relates to a light-emitting module. More specifically, the present technology relates to a light-emitting module and a display device that each include a light-emitting element and provide color display, and methods for manufacturing the light-emitting module and the display device.

BACKGROUND ART

There are cases where, in a light-emitting module for displaying an image, light from a self-luminous element such as an organic electroluminescence (EL) element is changed in color by a color filter to produce a desired color. Heretofore, there has been proposed a display device in which a protective layer is provided on a light incident surface, a side surface, and a light exit surface of a color filter (see, for example, Patent Document 1).

CITATION LIST

Patent Document

Patent Document 1: Japanese Patent Application Laid-Open No. 2015-187635

SUMMARY OF THE INVENTION

Problems to be Solved by the Invention

In the above-described conventional technology, a decrease in reliability due to a residual solvent or degassing is prevented by the protective layer provided around the color filter. However, an additional process is necessary for forming such a protective layer. Accordingly, there is a possibility that a manufacturing process may be complicated. Furthermore, there is a possibility that, particularly in a white pixel, black contrast and white balance decrease due to reflection from an electrode.

The present technology has been created in view of such a situation, and has an object to simplify a process of manufacturing a light-emitting module.

Solutions to Problems

The present technology has been made to solve the above-described problems, and a first aspect of the present technology is a light-emitting module and a display device that each include: light-emitting elements arranged on a substrate; a protective layer that covers the light-emitting elements; color changing members disposed in such a way as to correspond to at least some of the light-emitting elements with the protective layer interposed between the color changing members and the some of the light-emitting elements; and an optical layer that covers the color changing members and the protective layer, and condenses or scatters light with a curved shape. This produces an effect of forming the barrier layer and lens of the color changing member with the same material.

Furthermore, in the first aspect, it is also possible to adopt a configuration in which the color changing members are not disposed at positions of white pixels and the surface of the optical layer is formed in a concave shape at the positions of the white pixels. This produces an effect of forming the concave shape of the optical layer at the positions of the white pixels.

Furthermore, in the first aspect, the color changing members may be disposed at positions of pixels other than white pixels, and a surface of the optical layer may be formed in a convex shape at the positions of the pixels other than the white pixels. This produces an effect of forming the concave shape of the optical layer at the positions of the pixels other than the white pixels.

Moreover, in the first aspect, the surface of the optical layer may be formed in a convex shape at the positions of the pixels other than the white pixels in such a way as to collectively cover a plurality of the pixels other than the white pixels. This produces an effect of forming the convex shape at the positions of the pixels other than the white pixels in such a way as to collectively cover the plurality of the pixels other than the white pixels.

Additionally, in the first aspect, it is also possible to adopt the following configuration. The color changing members are disposed at positions of pixels other than white pixels, and are not disposed at positions of the white pixels. In addition, the optical layer is formed in a concave shape at the positions of the white pixels, and is formed in a convex shape at the positions of the pixels other than the white pixels such that the concave shape and the convex shape have curvatures different from each other. This produces an effect of forming the concave shape at the positions of the white pixels, with a curvature different from a curvature at the positions of the pixels other than the white pixels.

Furthermore, in the first aspect, the color changing members may be disposed at positions of pixels other than white pixels, and may be formed such that the color changing members disposed at positions of some pixels are thinner than the color changing members corresponding to other pixels. In addition, a surface of the optical layer may be formed in a concave shape at the positions of the some pixels. This produces an effect of forming the concave shape of the optical layer at the positions of the some pixels.

Moreover, in the first aspect, the optical layer may include a transparent material or a material containing at least an inorganic material.

Additionally, a film that covers a surface of the optical layer and reduces a reflectance at a predetermined wavelength may further be included in the first aspect. This produces an effect of preventing reflection of light.

Furthermore, a partition provided between each adjacent pair of pixels of the color changing members so as to reflect or absorb light may further be included in the first aspect. This produces an effect of preventing light from entering other pixels.

Moreover, in the first aspect, surfaces of the color changing members may be formed in a concave shape.

This produces an effect of refracting light from the front.

Furthermore, a second aspect of the present technology is a method for manufacturing a light-emitting module, the method including: forming electrodes on a substrate; forming light-emitting elements on the electrodes; forming a protective layer that covers the light-emitting elements; forming color changing members on the protective layer in such a way as to correspond to at least some of the light-emitting elements; and forming an optical layer in a curved shape by spin-coating, the optical layer covering the color changing members and the protective layer. This produces an effect of forming the barrier layer and lens of the color changing member simultaneously in a single process.

Effects of the Invention

According to the present technology, it is possible to achieve a beneficial effect of enabling the process of manufacturing a light-emitting module to be simplified. Note that the effects described here are not necessarily restrictive, and any of the effects described in the present disclosure may be achieved.

MODE FOR CARRYING OUT THE INVENTION

Modes for carrying out the present technology (hereinafter referred to as embodiments) will be described below. Descriptions will be provided in the following order.

1. First Embodiment (Example of Providing Optical Layer with Curved Shape)
2. Second Embodiment (Example of Changing Curvature of Optical Layer of White Pixel)
3. Third Embodiment (Example of Providing Antireflection Film on Surface)
4. Fourth Embodiment (Example of Collectively Covering RGB Pixels with Optical Layer)
5. Fifth Embodiment (Example of Color Filter with Surface in Concave Shape)
6. Sixth Embodiment (Example of Color Filters with Height Difference)
7. Seventh Embodiment (Example of Providing Gap Between Color Filters and Forming Curved Shape)
8. Application Examples 1. First Embodiment

[Configuration of Display Device]

Figure 1:
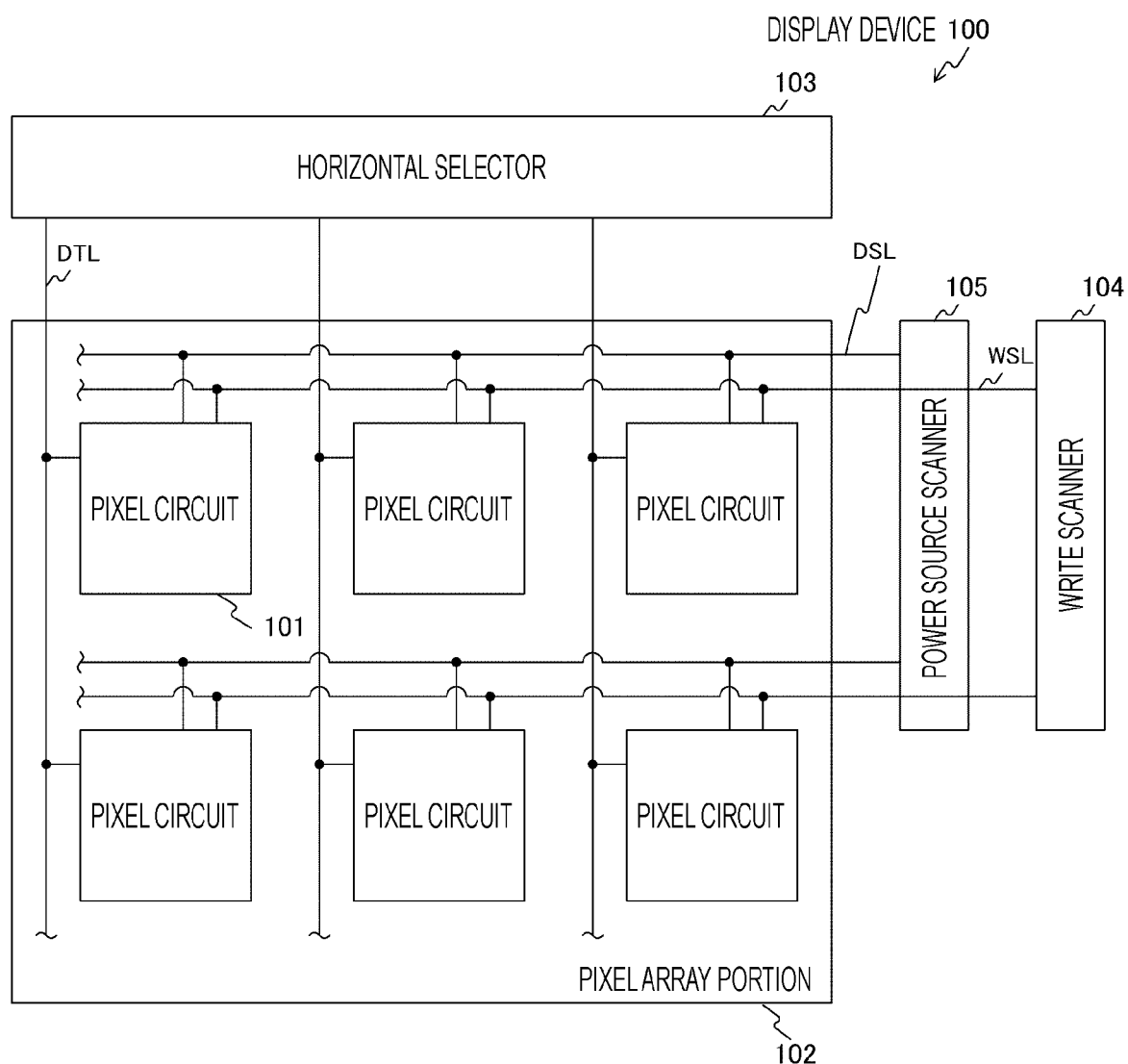
FIG. 1 is a diagram showing an example of an overall configuration of a display device 100 according to an embodiment of the present technology.

FIG. 1 is a diagram showing an example of an overall configuration of a display device 100 according to an embodiment of the present technology.

The display device 100 includes, for example, a pixel array portion 102 and a drive unit that drives the pixel array portion 102. The drive unit includes a horizontal selector 103, a write scanner 104, and a power source scanner 105.

The pixel array portion 102 includes a plurality of pixel circuits 101 arranged in a matrix. A power line DSL and a scanning line WSL are provided in such a way as to correspond to each row of the plurality of pixel circuits 101. Furthermore, a signal line DTL is provided in such a way as to correspond to each column of the plurality of pixel circuits 101.

The write scanner 104 sequentially supplies a control signal to each of the scanning lines WSL to perform line-sequential scanning of the pixel circuits 101 line by line. The power source scanner 105 supplies a source voltage to each of the power lines DSL in accordance with the line-sequential scanning. The horizontal selector 103 supplies a signal potential of a signal serving as a video signal and a reference potential to the signal lines DTL arranged in columns, in accordance with the line-sequential scanning.

Figure 2:
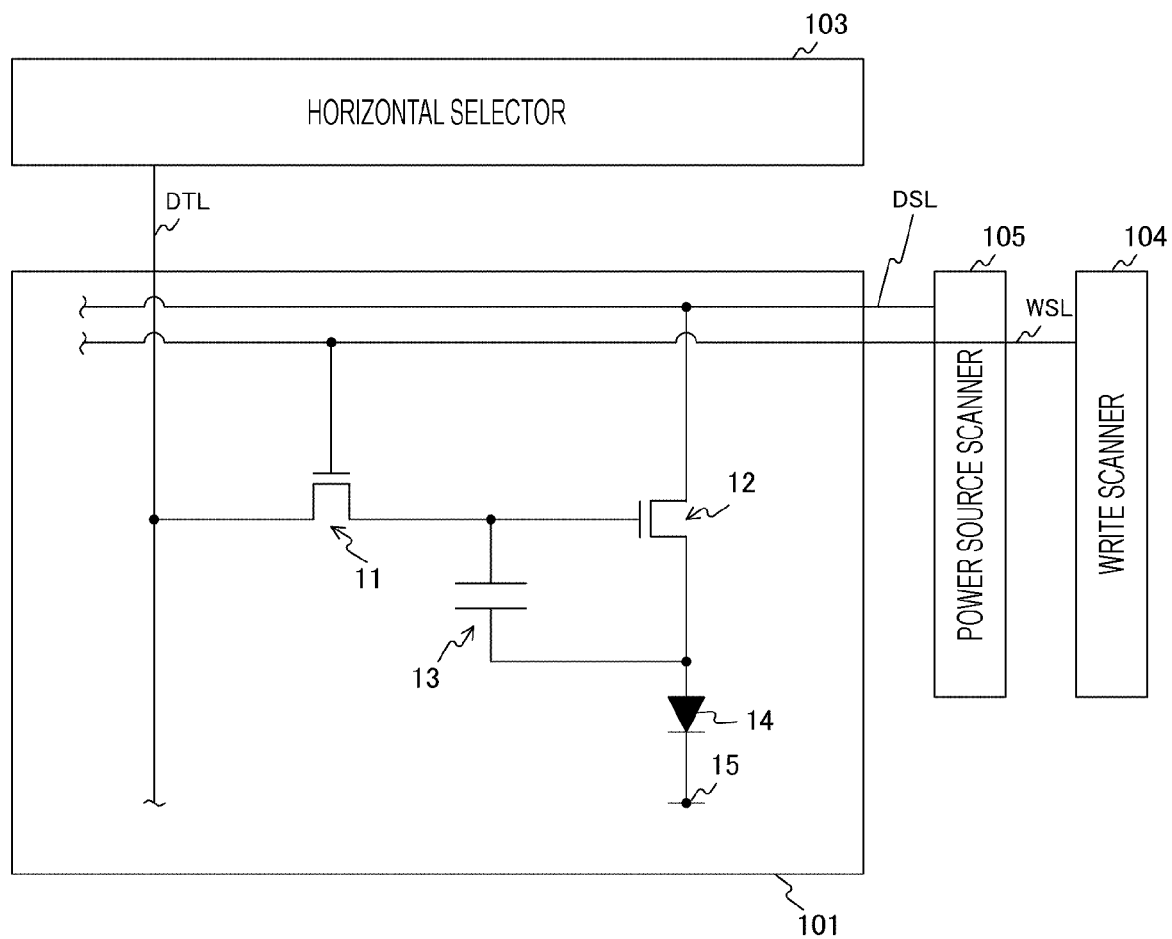
FIG. 2 is a diagram showing an example of a circuit configuration of a pixel circuit 101 according to the embodiment of the present technology.

FIG. 2 is a diagram showing an example of a circuit configuration of the pixel circuit 101 according to the embodiment of the present technology.

The pixel circuit 101 includes, for example, a light-emitting element 14 such as an organic EL element, a sampling transistor 11, a driving transistor 12, and a holding capacitor 13.

The sampling transistor 11 has a gate connected to the corresponding scanning line WSL. One of a source and a drain of the sampling transistor 11 is connected to the corresponding signal line DTL, and the other of the source and the drain is connected to the gate of the driving transistor 12.

The driving transistor 12 has a source connected to the anode of the light-emitting element 14, and a drain connected to the corresponding power line DSL. The cathode of the light-emitting element 14 is connected to a grounding wire 15. Note that the grounding wire 15 is laid such that the grounding wire 15 is common to all the pixel circuits 101.

The holding capacitor 13 is connected to the source and gate of the driving transistor 12 while being located therebetween. The holding capacitor 13 holds the signal potential of a video signal supplied from the signal line DTL.

[Pixel Structure]

Figure 3:
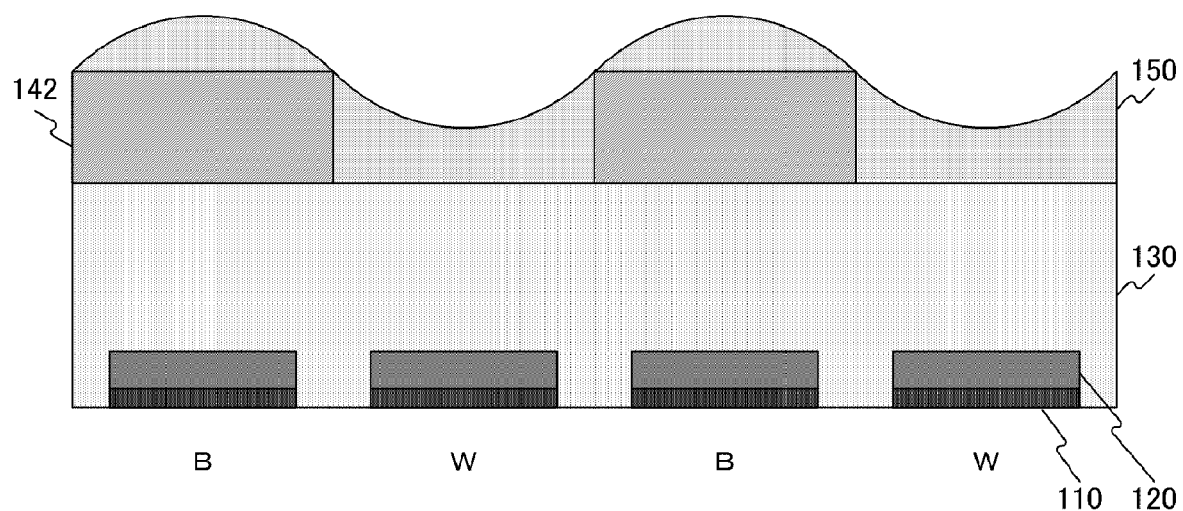
FIG. 3 is a diagram showing an example of a schematic cross-sectional structure of a light-emitting module according to a first embodiment of the present technology.

FIG. 3 is a diagram showing an example of a schematic cross-sectional structure of a light-emitting module according to a first embodiment of the present technology.

A pixel according to the first embodiment includes an electrode 110, a light-emitting element 120, a protective layer 130, a color filter 142 for blue color, and an optical layer 150.

The electrode 110 is an anode electrode of the light-emitting element 120. The electrode 110 may be, for example, a transparent electrode including metal, such as AlCu alloy or tin (Ti), or indium tin oxide (ITO), and the like.

The light-emitting element 120 corresponds to the above-described light-emitting element 14 that converts an electric signal into an optical signal. The light-emitting element 120 may be, for example, an organic EL element. In this case, an organic layer is formed between a cathode electrode and the electrode 110. The material of the cathode electrode may be, for example, a transparent electrode of MgAg alloy or indium tin oxide (ITO), and the like.

The protective layer 130 is a barrier layer that covers the light-emitting element 120 so as to prevent deterioration of the light-emitting element 120. The material of the protective layer 130 may be, for example, silicon nitride (SiN).

The color filter 142 is a color changing member that changes the color of light from the light-emitting element 120. The color filter 142 is formed as a result of, for example, mixing an organic material such as a photoresist with an organic pigment and performing photolithography. In this example, a cross section of a repeated portion of a white pixel and a blue pixel is shown, and the color filter 142 for blue color is disposed in such a way as to correspond to the light-emitting element 120 of the blue pixel. Meanwhile, no color filter is disposed at the position of the white pixel. Note that the color filter 142 is an example of the color changing member described in the claims.

The optical layer 150 is a layer that covers the color filter 142 and the protective layer 130 and condenses or scatters light with its curved shape. That is, the optical layer 150 is a barrier layer of the color filter 142, and is also a layer that functions as lenses. The material of the optical layer 150 may be an acrylic photopolymerizable composition. Furthermore, tin oxide ($TiO_2$) particles may be mixed as filler so as to improve a refractive index and also enhance capping properties. The optical layer 150 is formed by spin-coating of these materials. Accordingly, a convex lens is formed at the position of the blue pixel where the color filter 142 is disposed, and a concave lens is formed at the position of the white pixel where the color filter 142 is not disposed.

Figure 4:
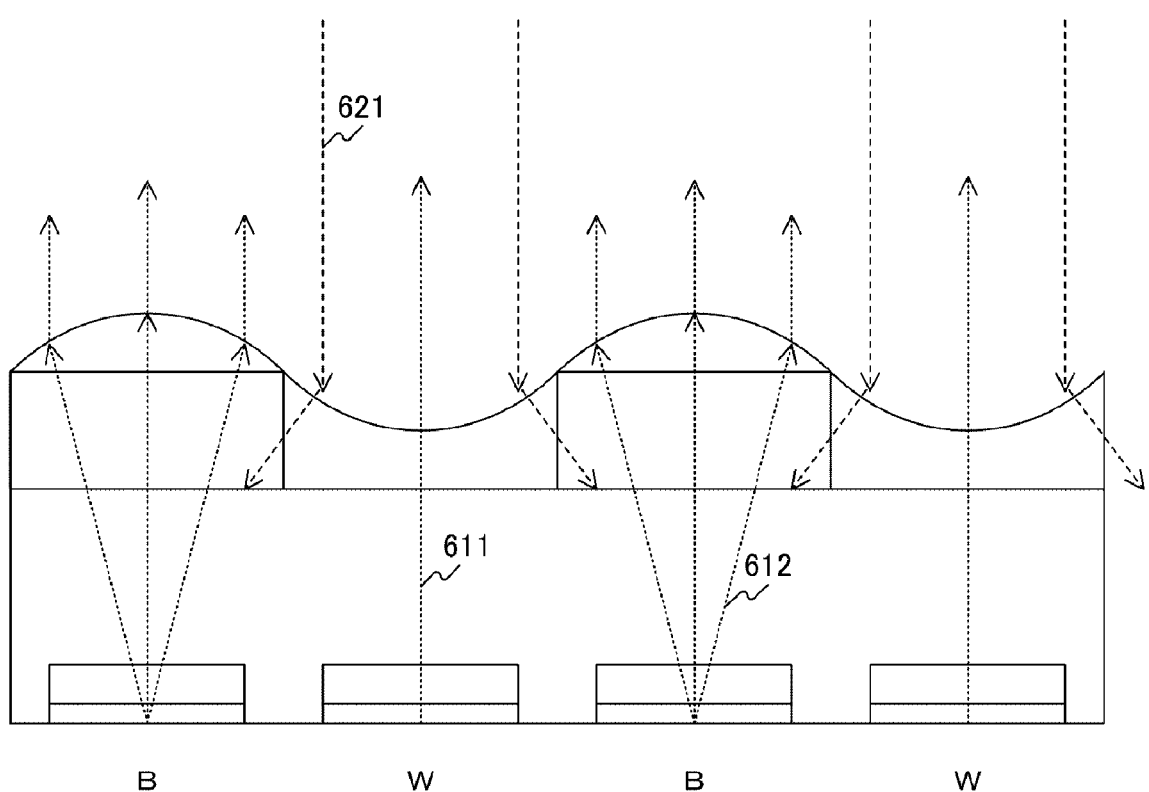
FIG. 4 is a diagram showing examples of optical characteristics of the light-emitting module according to the first embodiment of the present technology.

FIG. 4 is a diagram showing examples of optical characteristics of the light-emitting module according to the first embodiment of the present technology.

At the position of a blue pixel, light 612 from the light-emitting element 120 is changed in color to blue by the color filter 142 and emitted through the convex lens of the optical layer 150. Meanwhile, at the position of a white pixel, light 611 from the light-emitting element 120 is emitted through the concave lens of the optical layer 150.

In this case, even if light 621 is incident from the front, the angle of incidence is changed by the concave lens at the position of the white pixel, so that the light 621 is not reflected by the electrode 110. Therefore, with this concave lens, it is possible to prevent a decrease in black contrast and white balance due to reflection from the electrode 110.

[Manufacturing Process]

Figure 5:
FIG. 5 is a diagram showing an example of a process of manufacturing the light-emitting module according to the first embodiment of the present technology.
Figure 5:
Figure 5:
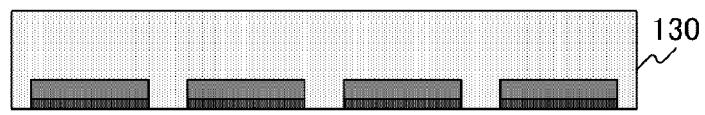
Figure 5:
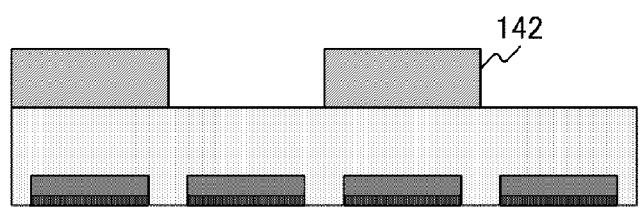
Figure 5:
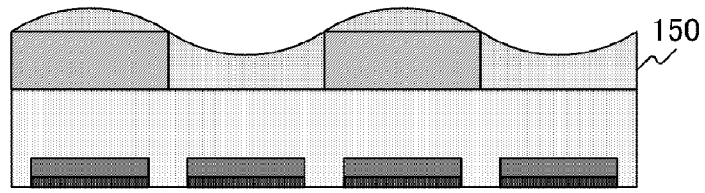

FIG. 5 is a diagram showing an example of a process of manufacturing the light-emitting module according to the first embodiment of the present technology.

First, the electrode 110 is formed on a substrate 190 as shown in "a" of FIG. 5. This electrode 110 is formed by lithography. That is, the electrode 110 is formed as follows. Patterning is provided after formation of a film of material to be the electrode 110, and masking with resist is performed. Then, unnecessary portions are removed by etching, and the resist of the mask is removed.

Then, the light-emitting element 120 is formed on the electrode 110 as shown in "b" of FIG. 5. The light-emitting element 120 is formed by vapor deposition. That is, the light-emitting element 120 is formed by deposition of a thin film of material to be the light-emitting element 120 in a gas phase.

Then, as shown in "c" of FIG. 5, the protective layer 130 is formed on the surface of the substrate on which the light-emitting element 120 has been formed. This protective layer 130 is formed by chemical vapor deposition (CVD).

Then, the color filter 142 is formed as shown in "d" of FIG. 5. This color filter 142 is formed by lithography.

Then, the optical layer 150 is formed as shown in "e" of FIG. 5. The optical layer 150 is formed by spin-coating of the material of the optical layer 150. That is, a liquid material is applied while a wafer is rotated. Thus, the material is applied to the surface thereof by use of centrifugal force. As a result, there is formed a film in a curved shape in accordance with the unevenness of the surface.

As described above, according to the first embodiment of the present technology, it is possible to simplify the process of manufacturing the light-emitting module by providing the optical layer 150 in a curved shape, which covers the color filter 142 and the protective layer 130. In this case, at the position of a blue pixel, it is possible to improve light emission efficiency by condensing light with the convex lens of the optical layer 150. Meanwhile, at the position of a white pixel, reflection from the electrode 110 can be prevented by the concave lens of the optical layer 150, so that a decrease in black contrast and white balance can also be prevented. The optical layer 150 is a barrier layer of the color filter 142 and also functions as lenses. Thus, both functions can be simultaneously achieved by the same member, so that no additional process is required.

2. Second Embodiment

In a second embodiment, the curvature of the concave shape of an optical layer 150 has been changed at the position of a white pixel. Note that the overall configuration of a display device 100 is similar to that in the first embodiment described above, and thus detailed description will be omitted.

[Pixel Structure]

Figure 6:
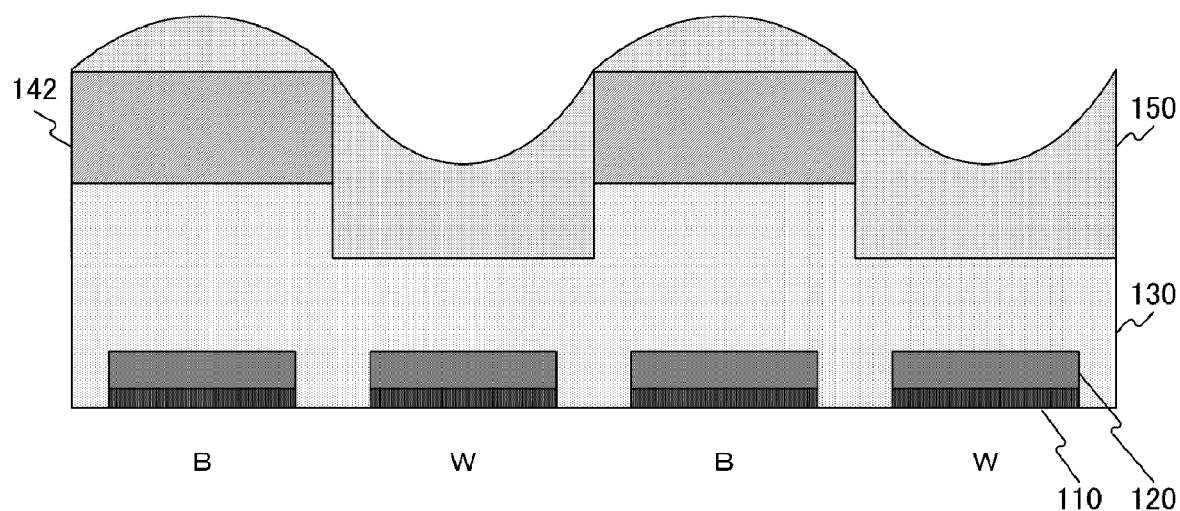
FIG. 6 is a diagram showing an example of a schematic cross-sectional structure of a light-emitting module according to a second embodiment of the present technology.

FIG. 6 is a diagram showing an example of a schematic cross-sectional structure of a light-emitting module according to the second embodiment of the present technology.

A pixel according to the second embodiment includes an electrode 110, a light-emitting element 120, a protective layer 130, a color filter 142 for blue color, and the optical layer 150, as in the first embodiment described above. However, the protective layer 130 has a recess at the position of a white pixel, and is lower in height than the protective layer 130 at the position of a blue pixel. Therefore, the curved shape of the optical layer 150 formed thereon is different from that in the first embodiment described above.

That is, the curvature of the concave shape of the optical layer 150 at the position of the white pixel is larger than the curvature of the convex shape of the optical layer 150 at the position of the blue pixel. It is possible to improve the power (refractive power) of the optical layer 150 as a lens at the position of the white pixel by changing the curvature in this manner.

[Manufacturing Process]

Figure 7:
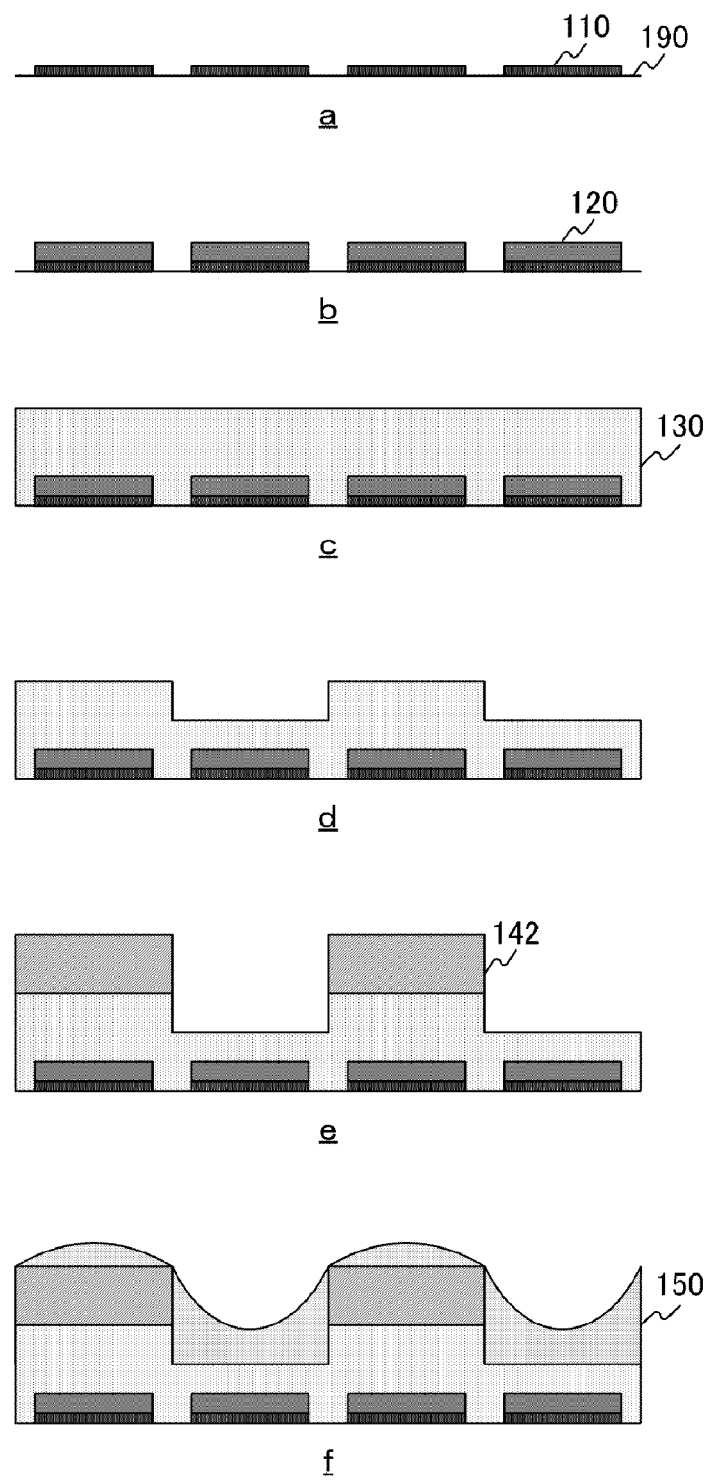
FIG. 7 is a diagram showing an example of a process of manufacturing the light-emitting module according to the second embodiment of the present technology.

FIG. 7 is a diagram showing an example of a process of manufacturing the light-emitting module according to the second embodiment of the present technology. Steps "a" to "c" of FIG. 7 are similar to those in the first embodiment described above.

As shown in "d" of FIG. 7, the protective layer 130 is partially removed at the position of the white pixel. This shape is formed as follows. For example, patterning is provided after formation of a film of silicon nitride (SiN), and masking with resist is performed. Then, the protective layer 130 is partially removed by dry etching at the position of the white pixel, and the resist of the mask is removed.

Then, the color filter 142 is formed as shown in "e" of FIG. 7. This color filter 142 is formed by lithography.

Then, the optical layer 150 is formed as shown in "f" of FIG. 7. The optical layer 150 is formed by spin-coating of the material of the optical layer 150. In the second embodiment, the height of the protective layer 130 is reduced at the position of the white pixel. Thus, the curvature of the concave shape of the optical layer 150 is larger than the curvature of the convex shape of the optical layer 150 at the position of the blue pixel.

As described above, according to the second embodiment of the present technology, it is possible to improve the power of the optical layer 150 as a lens by increasing the curvature of the concave shape of the optical layer 150 at the position of the white pixel.

3. Third Embodiment

In a third embodiment, an antireflection film is formed on the surface of an optical layer 150. Note that the overall configuration of a display device 100 is similar to that in the first embodiment described above, and thus detailed description will be omitted.

[Pixel Structure]

Figure 8:
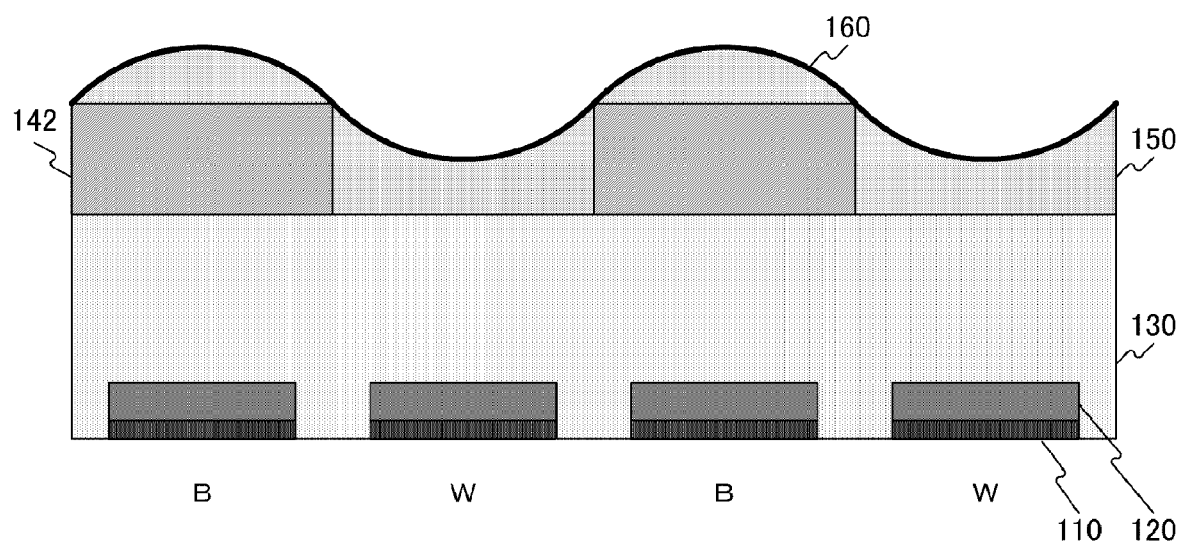
FIG. 8 is a diagram showing an example of a schematic cross-sectional structure of a light-emitting module according to a third embodiment of the present technology.

FIG. 8 is a diagram showing an example of a schematic cross-sectional structure of a light-emitting module according to the third embodiment of the present technology.

A pixel according to the third embodiment includes an electrode 110, a light-emitting element 120, a protective layer 130, a color filter 142 for blue color, and the optical layer 150, as in the first embodiment described above. In addition, the pixel according to the third embodiment further includes an antireflection film 160 on the surface of the optical layer 150.

The antireflection film 160 is a film that covers the surface of the optical layer 150, and is an antireflection coating that reduces reflectance at a predetermined wavelength. Thus, reflection of external light can be prevented, so that the performance of the display device 100 can be improved.

[Manufacturing Process]

Figure 9:
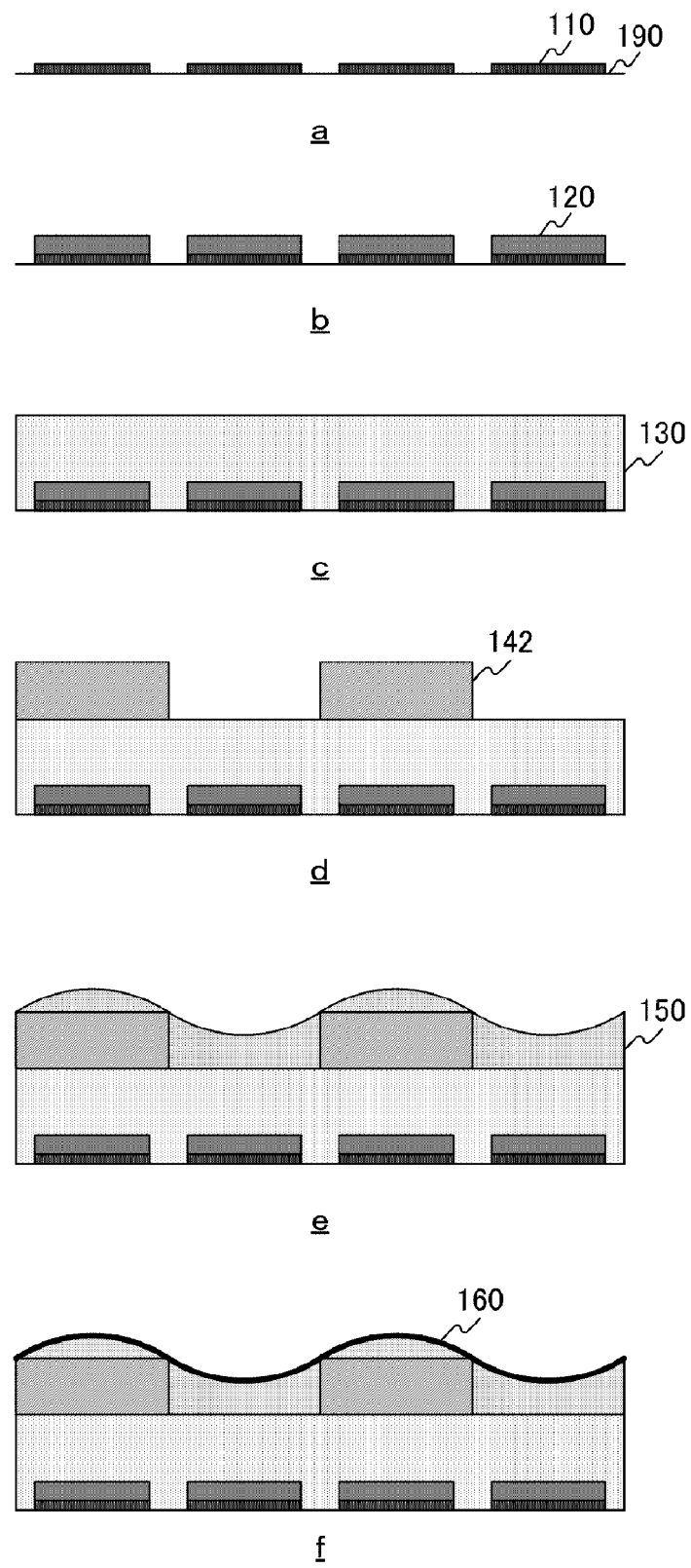
FIG. 9 is a diagram showing an example of a process of manufacturing the light-emitting module according to the third embodiment of the present technology.

FIG. 9 is a diagram showing an example of a process of manufacturing the light-emitting module according to the third embodiment of the present technology. Steps "a" to "e" of FIG. 9 are similar to those in the first embodiment described above.

As shown in "f" of FIG. 9, the antireflection film 160 is formed on the surface of the optical layer 150. The antireflection film 160 is formed by chemical vapor deposition (CVD). The material of the antireflection film 160 may be, for example, silicon dioxide ($SiO_2$).

As described above, according to the third embodiment of the present technology, reflection of external light can be prevented by formation of the antireflection film 160 on the surface of the optical layer 150, so that the performance of the display device 100 can be improved.

4. Fourth Embodiment

In a fourth embodiment, the convex shape of an optical layer 150 is formed to collectively cover a plurality of pixels. Note that the overall configuration of a display device 100 is similar to that in the first embodiment described above, and thus detailed description will be omitted.

[Pixel Structure]

Figure 10:
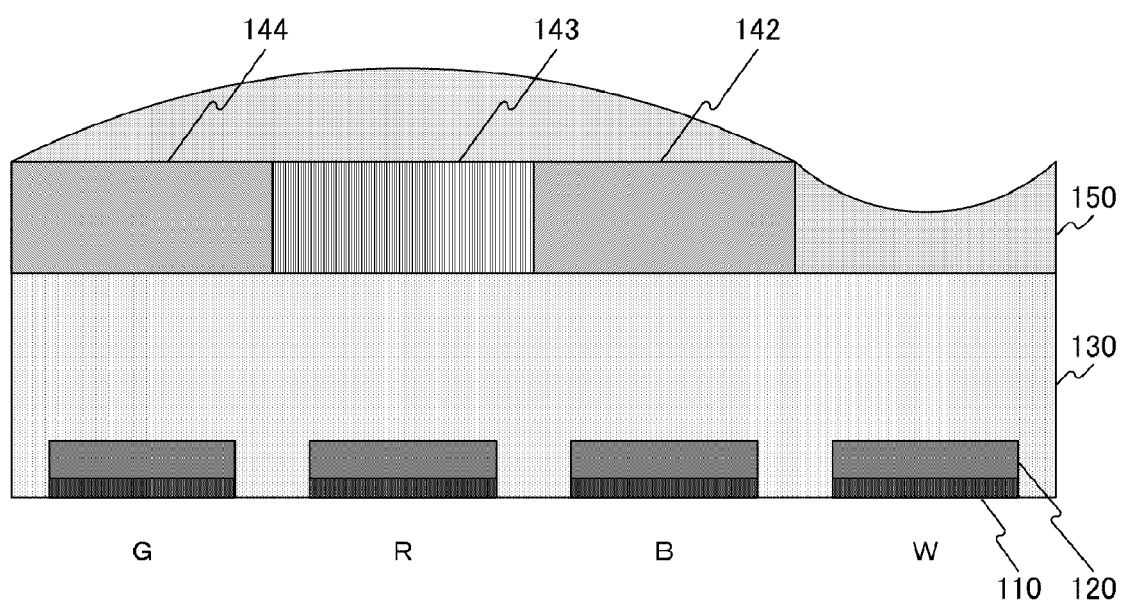
FIG. 10 is a diagram showing an example of a schematic cross-sectional structure of a light-emitting module according to a fourth embodiment of the present technology.

FIG. 10 is a diagram showing an example of a schematic cross-sectional structure of a light-emitting module according to the fourth embodiment of the present technology.

A pixel according to the fourth embodiment includes an electrode 110, a light-emitting element 120, a protective layer 130, color filters 142 to 144, and the optical layer 150. That is, the color filter 142 for blue color is disposed in such a way as to correspond to the light-emitting element 120 of a blue pixel, the color filter 143 for red color is disposed in such a way as to correspond to the light-emitting element 120 of a red pixel, and the color filter 144 for green color is disposed in such a way as to correspond to the light-emitting element 120 of a green pixel. Note that the color filters 142 to 144 are examples of the color changing member described in the claims.

In the fourth embodiment, the color filters 142 to 144 are closely located. Therefore, the optical layer 150 is formed thereon in a convex shape such that the convex-shaped portion of the optical layer 150 collectively covers the color filters 142 to 144. Meanwhile, a concave shape of the optical layer 150 is formed at the position of a white pixel, as in the first embodiment described above.

[Manufacturing Process]

Figure 11:
FIG. 11 is a diagram showing an example of a process of manufacturing the light-emitting module according to the fourth embodiment of the present technology.
Figure 11:
Figure 11:
Figure 11:
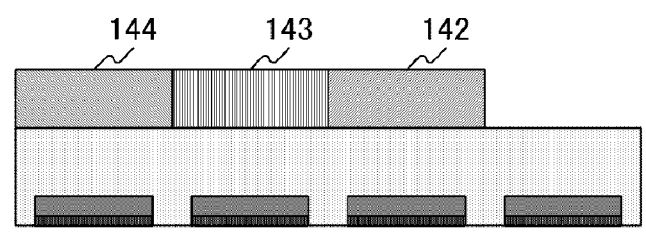
Figure 11:
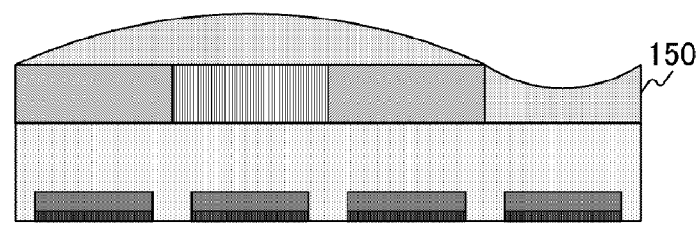

FIG. 11 is a diagram showing an example of a process of manufacturing the light-emitting module according to the fourth embodiment of the present technology. Steps "a" to "c" of FIG. 7 are similar to those in the first embodiment described above.

The color filters 142 to 144 are formed as shown in "d" of FIG. 11. These color filters 142 to 144 are sequentially formed by lithography.

Then, the optical layer 150 is formed as shown in "e" of FIG. 5. The optical layer 150 is formed by spin-coating of the material of the optical layer 150. In this case, the convex shape of the optical layer 150 is formed to collectively cover the color filters 142 to 144.

As described above, in the fourth embodiment of the present technology, the convex shape of the optical layer 150 is formed to collectively cover the color filters 142 to 144. As a result, it is possible to improve the performance of the optical layer 150 as a lens in a case where a viewing angle is increased.

5. Fifth Embodiment

In a fifth embodiment, the surface of a color filter is formed in a concave shape. Note that the overall configuration of a display device 100 is similar to that in the first embodiment described above, and thus detailed description will be omitted.

[Pixel Structure]

Figure 12:
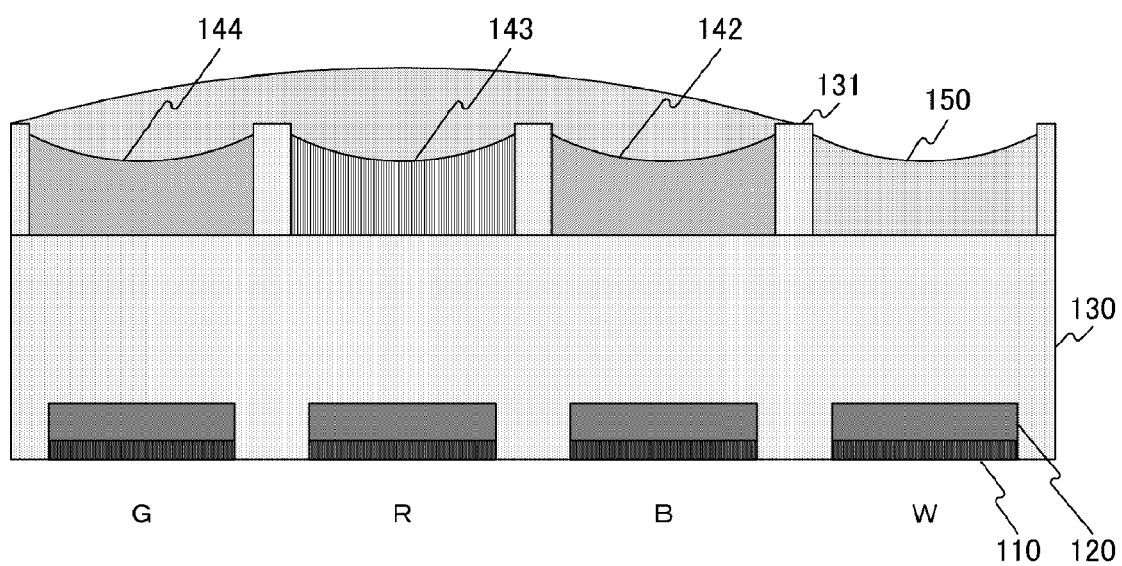
FIG. 12 is a diagram showing an example of a schematic cross-sectional structure of a light-emitting module according to a fifth embodiment of the present technology.

FIG. 12 is a diagram showing an example of a schematic cross-sectional structure of a light-emitting module according to the fifth embodiment of the present technology.

A pixel according to the fifth embodiment includes an electrode 110, a light-emitting element 120, a protective layer 130, color filters 142 to 144, and an optical layer 150, as in the fourth embodiment described above. However, a partition 131 is provided between each adjacent pair of pixels, and the surfaces of the color filters 142 to 144 are formed in a concave shape.

The concave shape of the surface of each of the color filters 142 to 144 refracts light from the front. Thus, optical performance is improved.

The partition 131 reflects or absorbs light, and prevents light refracted by the concave shape of the surface of each of the color filters 142 to 144 from entering other pixels.

[Manufacturing Process]

Figure 13:
FIG. 13 is a diagram showing an example of a process of manufacturing the light-emitting module according to the fifth embodiment of the present technology.
Figure 13:
Figure 13:
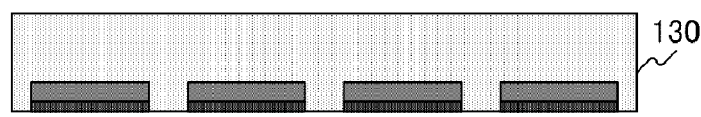
Figure 13:
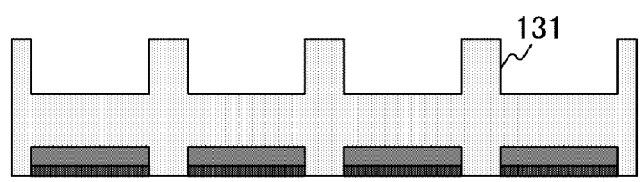
Figure 13:
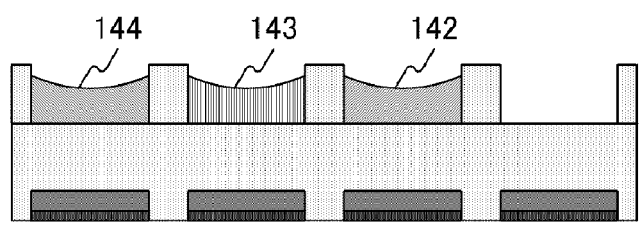
Figure 13:
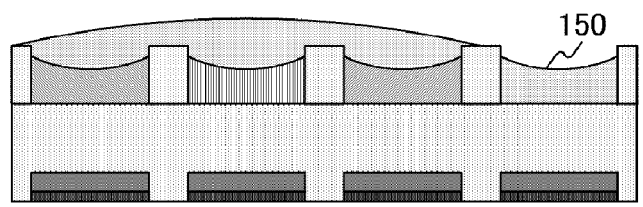

FIG. 13 is a diagram showing an example of a process of manufacturing the light-emitting module according to the fifth embodiment of the present technology. Steps "a" to "c" of FIG. 7 are similar to those in the first embodiment described above.

As shown in "d" of FIG. 13, the protective layer 130 is partially removed at the position of each pixel to form the partitions 131. This shape is formed as follows. For example, patterning is provided after formation of a film of silicon nitride (SiN), and masking with resist is performed. Then, the protective layer 130 is partially removed by dry etching at the position of the white pixel, and the resist of the mask is removed.

Then, as shown in "e" of FIG. 13, the color filters 142 to 144 are formed at the respective positions of blue, red, and green colors divided by the partitions 131. These color filters 142 to 144 are formed by sequential spin-coating of respective materials.

Then, the optical layer 150 is formed as shown in "f" of FIG. 7. The optical layer 150 is formed by spin-coating of the material of the optical layer 150. In this case, the convex shape of the optical layer 150 is formed to collectively cover the color filters 142 to 144, as in the fourth embodiment described above.

As described above, according to the fifth embodiment of the present technology, optical performance can be improved by the concave shape of the surface of each of the color filters 142 to 144. In addition, the partition 131 can prevent light refracted by the concave shape from entering other pixels.

6. Sixth Embodiment

In a sixth embodiment, color filters for some colors are different in thickness from the rest of color filters. Note that the overall configuration of a display device 100 is similar to that in the first embodiment described above, and thus detailed description will be omitted.

[Pixel Structure]

Figure 14:
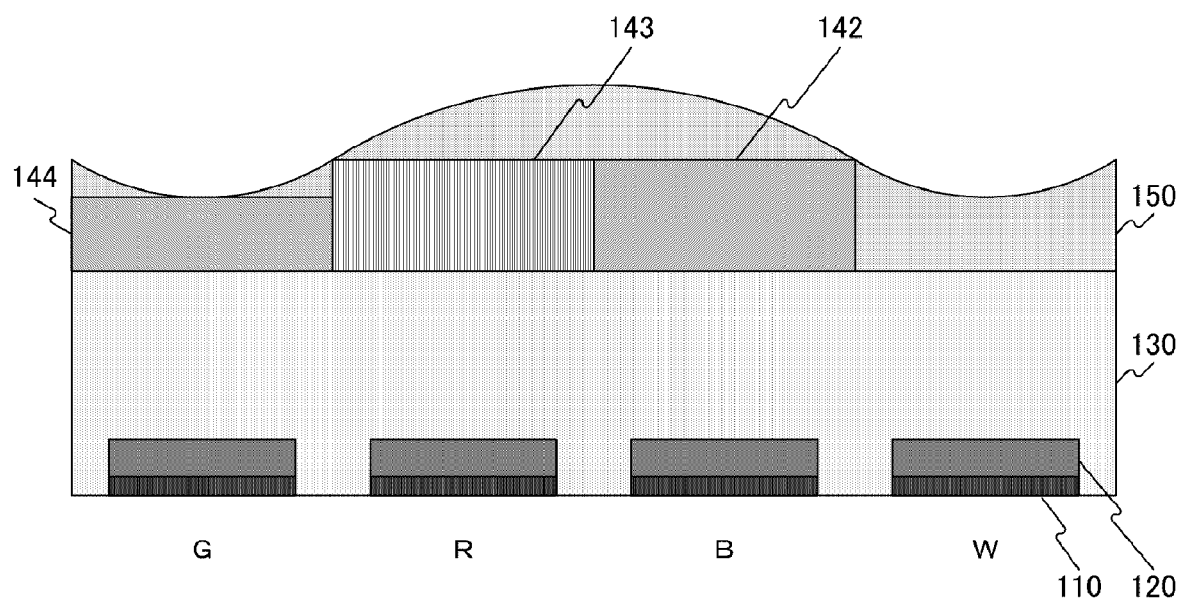
FIG. 14 is a diagram showing an example of a schematic cross-sectional structure of a light-emitting module according to a sixth embodiment of the present technology.

FIG. 14 is a diagram showing an example of a schematic cross-sectional structure of a light-emitting module according to the sixth embodiment of the present technology.

A pixel according to the sixth embodiment includes an electrode 110, a light-emitting element 120, a protective layer 130, color filters 142 to 144, and an optical layer 150, as in the fourth embodiment described above. However, the color filter 144 for green color is formed such that the color filter 144 is thinner than the color filters 142 and 143 for the other colors. As a result, color balance can be adjusted. Furthermore, as a result of thus providing the color filters with different thicknesses, the optical layer 150 formed thereon has a concave shape at the position of the green pixel.

[Manufacturing Process]

Figure 15:
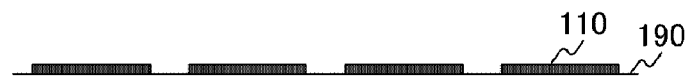
FIG. 15 is a diagram showing an example of a process of manufacturing the light-emitting module according to the sixth embodiment of the present technology.
Figure 15:
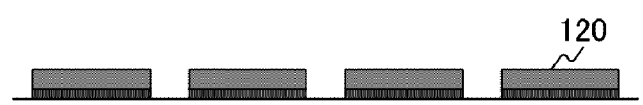
Figure 15:
Figure 15:
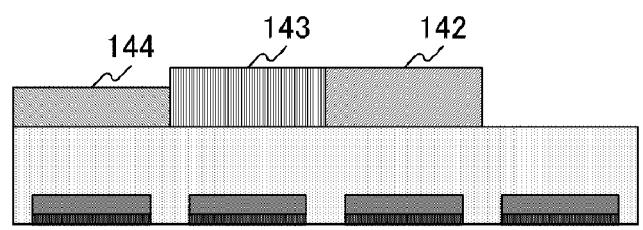
Figure 15:
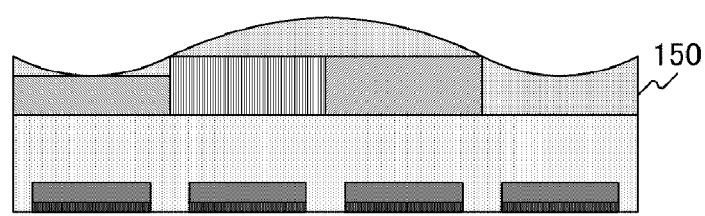

FIG. 15 is a diagram showing an example of a process of manufacturing the light-emitting module according to the sixth embodiment of the present technology. Steps "a" to "c" of FIG. 7 are similar to those in the first embodiment described above.

The color filters 142 to 144 are formed as shown in "d" of FIG. 11. These color filters 142 to 144 are sequentially formed by lithography. In this case, the color filter 144 for green color is formed such that the color filter 144 is thinner than the color filters 142 and 143 for the other colors.

Then, the optical layer 150 is formed as shown in "e" of FIG. 5. The optical layer 150 is formed by spin-coating of the material of the optical layer 150. In this case, the convex shape of the optical layer 150 is formed to collectively cover the color filter 142 for blue color and the color filter 143 for red color. Meanwhile, the concave shape of the optical layer 150 is formed on the color filter 144 for green color. Furthermore, as in the other embodiments, the concave shape of the optical layer 150 is formed at the position of a white pixel.

As described above, according to the sixth embodiment of the present technology, it is possible to adjust color balance by changing the thicknesses of some of the color filters 142 to 144.

7. Seventh Embodiment

In a seventh embodiment, color filters 142 to 144 are arranged with gaps therebetween. Note that the overall configuration of a display device 100 is similar to that in the first embodiment described above, and thus detailed description will be omitted.

[Pixel Structure]

Figure 16:
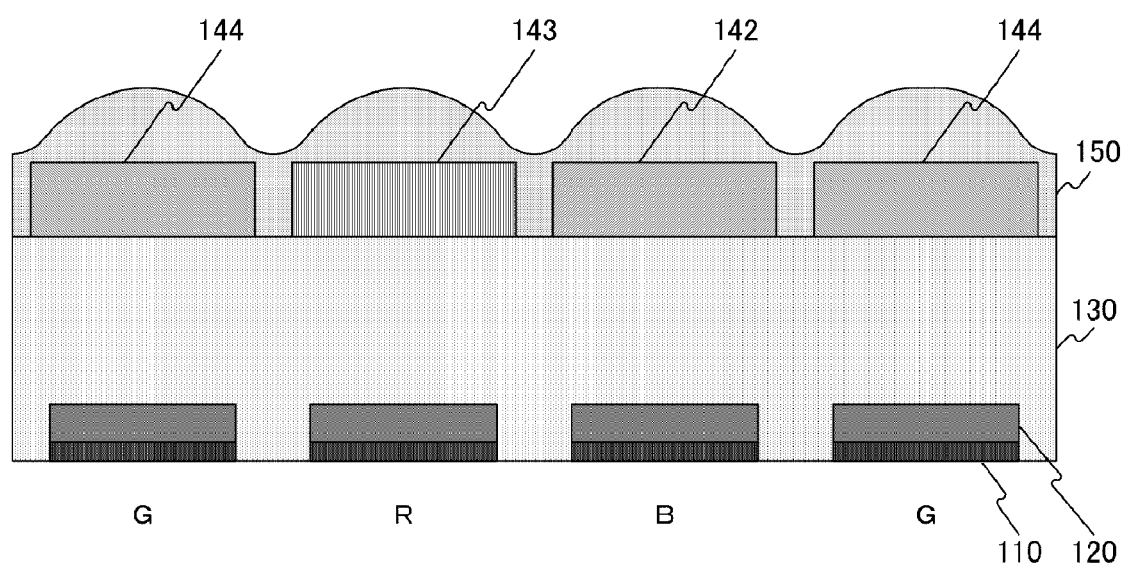
FIG. 16 is a diagram showing an example of a schematic cross-sectional structure of a light-emitting module according to a seventh embodiment of the present technology.

FIG. 16 is a diagram showing an example of a schematic cross-sectional structure of a light-emitting module according to the seventh embodiment of the present technology.

A pixel according to the seventh embodiment includes an electrode 110, a light-emitting element 120, a protective layer 130, the color filters 142 to 144, and an optical layer 150, as in the fourth embodiment described above. However, the color filters 142 to 144 are arranged with gaps therebetween. As a result, the optical layer 150 is formed thereon such that the optical layer 150 has a convex shape separately at each pixel position.

[Manufacturing Process]

Figure 17:
FIG. 17 is a diagram showing an example of a process of manufacturing the light-emitting module according to the seventh embodiment of the present technology.
Figure 17:
Figure 17:
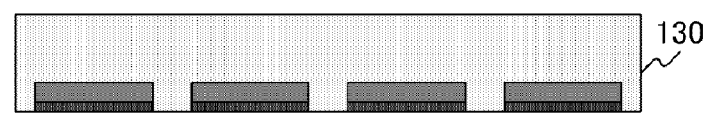
Figure 17:
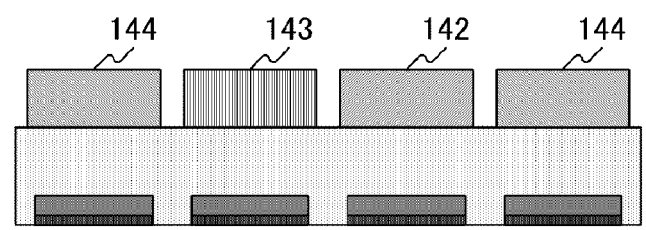
Figure 17:
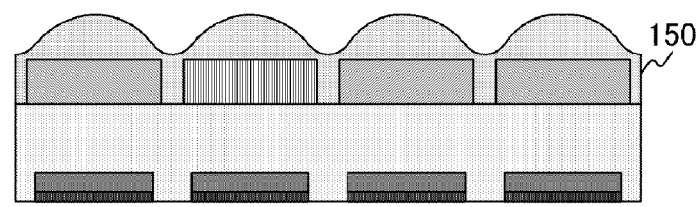

FIG. 17 is a diagram showing an example of a process of manufacturing the light-emitting module according to the seventh embodiment of the present technology. Steps "a" to "c" of FIG. 7 are similar to those in the first embodiment described above.

The color filters 142 to 144 are formed as shown in "d" of FIG. 11. These color filters 142 to 144 are sequentially formed by lithography. At this time, the color filters 142 to 144 are formed with gaps therebetween.

Then, the optical layer 150 is formed as shown in "e" of FIG. 5. The optical layer 150 is formed by spin-coating of the material of the optical layer 150. In this case, the convex shape of the optical layer 150 is separately formed at each of blue, red, and green pixel positions. Meanwhile, a concave shape is formed at the position of a white pixel.

As described above, in the seventh embodiment of the present technology, the convex shape of the optical layer 150 is separately formed at each of the blue, red, and green pixel positions. As a result, it is possible to provide the optical layer 150 formed in a convex shape at positions of pixels other than a white pixel, regardless of the disposition of the white pixel.

8. Application Examples

Described below are examples of electronic devices to which the display devices of the above-described embodiments can be applied.

Figure 18:
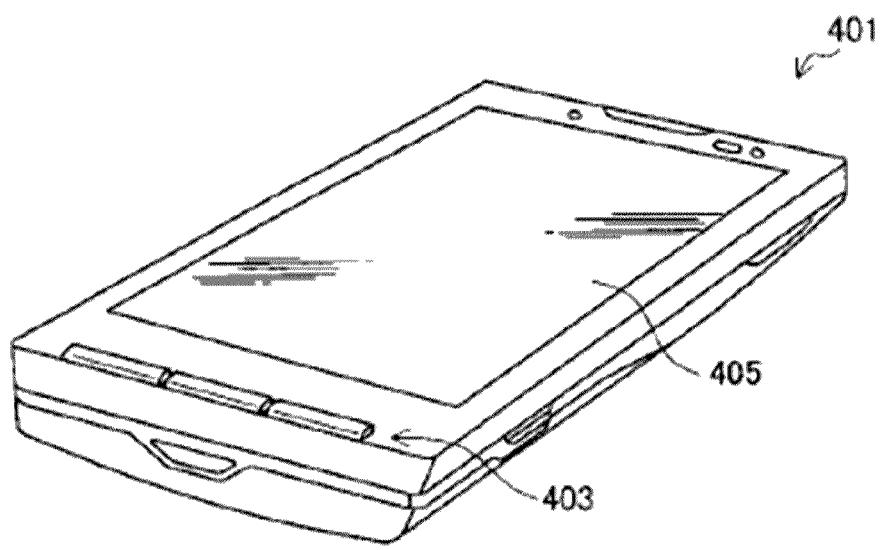
FIG. 18 is a diagram showing the appearance of a smartphone 401 as a first application example of the embodiments of the present technology.

FIG. 18 is a diagram showing the appearance of a smartphone 401 as a first application example of the embodiments of the present technology. The smartphone 401 includes an operation unit 403 and a display unit 405. The operation unit 403 receives an operation input from a user. The display unit 405 displays various types of information. The display unit 405 may include any of the display devices according to the above-described embodiments.

Figure 19:
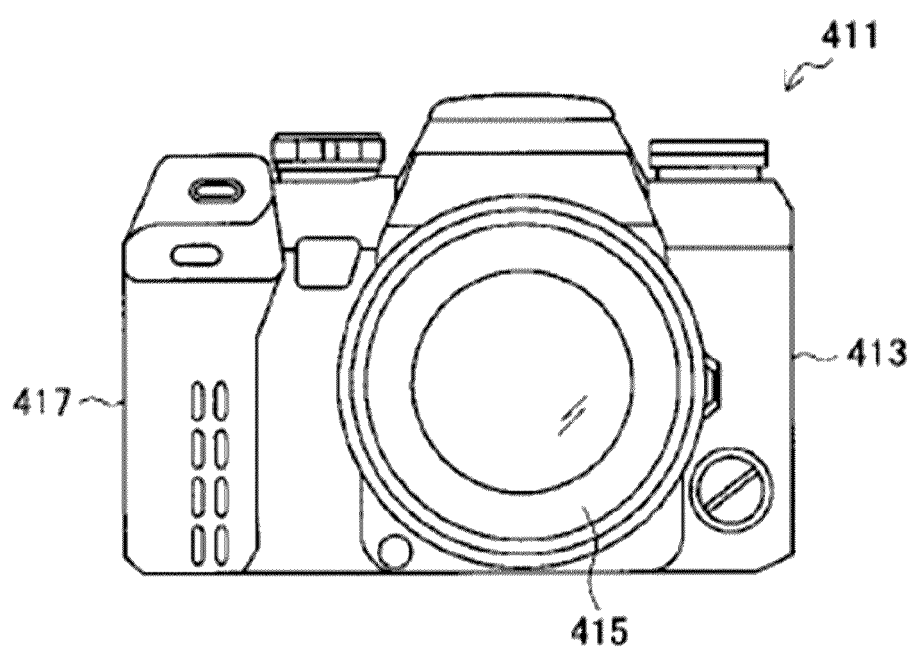
FIG. 19 is a diagram showing the appearance of a digital camera 411 viewed from the front (subject side), as a second application example of the embodiments of the present technology.
Figure 20:
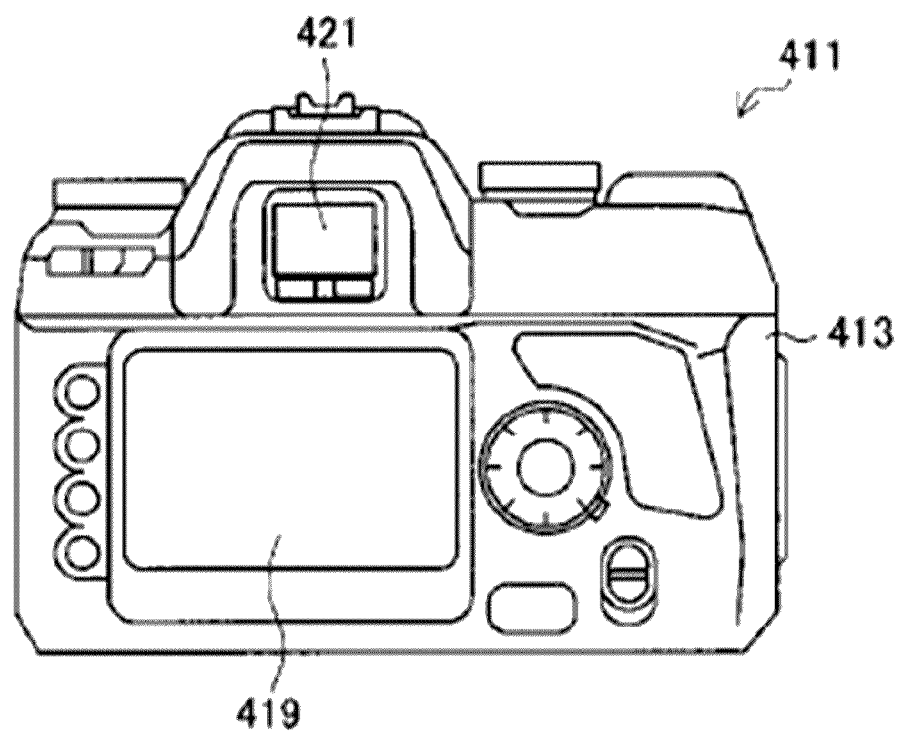
FIG. 20 is a diagram showing the appearance of the digital camera 411, viewed from the back, as the second application example of the embodiments of the present technology.

FIG. 19 is a diagram showing the appearance of a digital camera 411 viewed from the front (subject side), as a second application example of the embodiments of the present technology. FIG. 20 is a diagram showing the appearance of the digital camera 411, viewed from the back, as the second application example of the embodiments of the present technology. The digital camera 411 includes a main body (camera body) 413, an interchangeable lens unit 415, and a grip portion 417 to be held by a user at the time of capturing an image. Furthermore, the digital camera 411 also includes a monitor 419 and an electronic viewfinder (EVF) 421. The monitor 419 displays various types of information. The EVF 421 displays a through image to be viewed by the user at the time of capturing an image. The monitor 419 and the EVF 421 may include any of the display devices according to the above-described embodiments.

Figure 21:
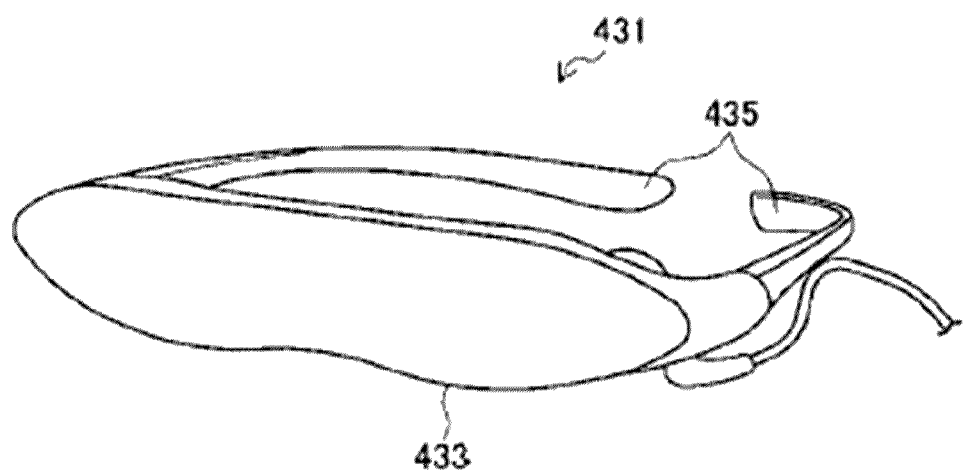
FIG. 21 is a diagram showing the appearance of an HMD 431 as a third application example of the embodiments of the present technology.

FIG. 21 is a diagram showing the appearance of an HMD 431 as a third application example of the embodiments of the present technology. The head mounted display (HMD) 431 includes a spectacle-type display unit 433 and ear hook portions 435. The display unit 433 displays various types of information. The ear hook portions 435 are hooked on a user's ears when the user wears the HMD 431. The display unit 433 may include any of the display devices according to the above-described embodiments.

Some examples of electronic devices to which the display device according to each embodiment can be applied have been described above. Note that the electronic devices to which the display device according to each embodiment can be applied are not limited to those illustrated above. The display device can be applied to a display device to be mounted on an electronic device of any field, such as a television device, an electronic book, a PDA, a notebook PC, a video camera, or a game device, that provides display on the basis of an image signal input from the outside or internally generated.

Note that the above-described embodiments are examples for embodying the present technology, and there are correspondence relationships between the matters in the embodiments and the matters specifying the invention in the claims. Similarly, there are correspondence relationships between the matters specifying the invention in the claims and the matters in the embodiments of the present technology to which the same names have been assigned. However, the present technology is not limited to the embodiments, and it is possible to embody the present technology by making various modifications to the embodiments without departing from the gist of the present technology.

Note that the effects described in the present specification are merely illustrative and not restrictive, and other effects may also be achieved.

Note that the present technology can also adopt the following configurations.

(1) A light-emitting module including:
light-emitting elements arranged on a substrate;
a protective layer that covers the light-emitting elements;
color changing members disposed in such a way as to correspond to at least some of the light-emitting elements with the protective layer interposed between the color changing members and the some of the light-emitting elements; and
an optical layer that covers the color changing members and the protective layer, and condenses or scatters light with a curved shape.

(2) The light-emitting module according to (1) above, in which
the color changing members are not disposed at positions of white pixels, and
a surface of the optical layer is formed in a concave shape at the positions of the white pixels.

(3) The light-emitting module according to (1) or (2) above, in which
the color changing members are disposed at positions of pixels other than white pixels, and
a surface of the optical layer is formed in a convex shape at the positions of the pixels other than the white pixels.

(4) The light-emitting module according to (3) above, in which
the surface of the optical layer is formed in a convex shape at the positions of the pixels other than the white pixels in such a way as to collectively cover a plurality of the pixels other than the white pixels.

(5) The light-emitting module according to (1) above, in which
the color changing members are disposed at positions of pixels other than white pixels, and are not disposed at positions of the white pixels, and
the optical layer is formed in a concave shape at the positions of the white pixels, and is formed in a convex shape at the positions of the pixels other than the white pixels such that the concave shape and the convex shape have curvatures different from each other.

(6) The light-emitting module according to (1) above, in which
the color changing members are disposed at positions of pixels other than white pixels, and are formed such that the color changing members disposed at positions of some pixels are thinner than the color changing members corresponding to other pixels, and a surface of the optical layer is formed in a concave shape at the positions of the some pixels.

(7) The light-emitting module according to any one of (1) to (6) above, in which
the optical layer includes a transparent material.

(8) The light-emitting module according to any one of (1) to (6) above, in which
the optical layer includes a material containing at least an inorganic material.

(9) The light-emitting module according to any one of (1) to (8) above, further including:
a film that covers a surface of the optical layer, and reduces a reflectance at a predetermined wavelength.

(10) The light-emitting module according to any one of (1) to (9) above, further including:
a partition provided between each adjacent pair of pixels of the color changing members so as to reflect or absorb light.

(11) The light-emitting module according to (10) above, in which
surfaces of the color changing members are formed in a concave shape.

(12) A display device including:
a substrate;
light-emitting elements arranged on the substrate;
a protective layer that covers the light-emitting elements;
color changing members disposed in such a way as to correspond to at least some of the light-emitting elements with the protective layer interposed between the color changing members and the some of the light-emitting elements; and
an optical layer that covers the color changing members and the protective layer, and condenses or scatters light with a curved shape.

(12) A method for manufacturing a light-emitting module, the method including:
forming electrodes on a substrate;
forming light-emitting elements on the electrodes;
forming a protective layer that covers the light-emitting elements;
forming color changing members on the protective layer in such a way as to correspond to at least some of the light-emitting elements; and
forming an optical layer in a curved shape by spin-coating, the optical layer covering the color changing members and the protective layer.

REFERENCE SIGNS LIST

11 Sampling transistor
12 Driving transistor
13 Holding capacitor
14 Light-emitting element
15 Grounding wire
100 Display device
101 Pixel circuit
102 Pixel array portion
103 Horizontal selector
104 Write scanner
105 Power source scanner
110 Electrode
120 Light-emitting element
130 Protective layer
131 Partition
142 to 144 Color filter
150 Optical layer
160 Antireflection film
190 Substrate

The invention claimed is:

1. A light-emitting module comprising:
light-emitting elements arranged on a substrate corresponding to positions of a plurality of pixels, the plurality of pixels including white pixels and non-white pixels;
a protective layer that covers the light-emitting elements;
color changing members disposed in such a way as to correspond to a subset of the light-emitting elements with the protective layer interposed between the color changing members and the subset of the light-emitting elements, the color changing members being disposed at the positions of the non-white pixels and not being disposed at the positions of the white pixels; and
an optical layer that covers the color changing members and the protective layer, and condenses or scatters light with a curved shape,
a surface of the optical layer is formed in a concave shape at the positions of the white pixels.

2. The light-emitting module according to claim 1, wherein
a surface of the optical layer is formed in a convex shape at the positions of the non-white pixels.

3. The light-emitting module according to claim 2, wherein
the surface of the optical layer is formed in a convex shape at the positions of the non-white pixels in such a way as to collectively cover a plurality of the non-white pixels.

4. The light-emitting module according to claim 1, wherein
the optical layer is formed in a convex shape at the positions of the non-white pixels such that the concave shape and the convex shape have curvatures different from each other.

5. The light-emitting module according to claim 1, wherein
the color changing members are formed such that the color changing members disposed at positions of some pixels are thinner than the color changing members corresponding to other pixels, and
a surface of the optical layer is formed in a concave shape at the positions of the some pixels.

6. The light-emitting module according to claim 1, wherein
the optical layer includes a transparent material.

7. The light-emitting module according to claim 1, wherein
the optical layer includes a material containing at least an inorganic material.

8. The light-emitting module according to claim 1, further comprising:
a film that covers a surface of the optical layer, and reduces a reflectance at a predetermined wavelength.

9. The light-emitting module according to claim 1, further comprising:
a partition provided between each adjacent pair of pixels of the color changing members so as to reflect or absorb light.

10. The light-emitting module according to claim 9, wherein
surfaces of the color changing members are formed in a concave shape.

11. A display device comprising:
a substrate;
light-emitting elements arranged on the substrate corresponding to positions of a plurality of pixels, the plurality of pixels including white pixels and non-white pixels;
a protective layer that covers the light-emitting elements;
color changing members disposed in such a way as to correspond to a subset of the light-emitting elements with the protective layer interposed between the color changing members and the subset of the light-emitting elements, the color changing members being disposed at the positions of the non-white pixels and not being disposed at the positions of the white pixels; and
an optical layer that covers the color changing members and the protective layer, and condenses or scatters light with a curved shape,
wherein a surface of the optical layer is formed in a concave shape at the positions of the white pixels.

12. A method for manufacturing a light-emitting module, the method comprising:
forming electrodes on a substrate;
forming light-emitting elements on the electrodes;
forming a protective layer that covers the light-emitting elements;
forming color changing members on the protective layer in such a way as to correspond to at least some of the light-emitting elements; and
forming an optical layer in a curved shape by spin-coating, the optical layer covering the color changing members and the protective layer.

* * * * *